(12) United States Patent
Jung

(10) Patent No.: US 7,253,468 B2
(45) Date of Patent: Aug. 7, 2007

(54) FLASH MEMORY AND METHODS OF FABRICATING THE SAME

(75) Inventor: Jin Hyo Jung, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 228 days.

(21) Appl. No.: 10/971,585

(22) Filed: Oct. 22, 2004

(65) Prior Publication Data

US 2005/0087796 A1    Apr. 28, 2005

(30) Foreign Application Priority Data

Oct. 23, 2003  (KR) .................... 10-2003-0074438

(51) Int. Cl.
*H01L 29/788* (2006.01)
*H01L 29/76* (2006.01)

(52) U.S. Cl. ............... 257/315; 257/316; 257/317; 257/318; 257/319; 257/320; 257/321; 257/322; 257/323

(58) Field of Classification Search ......... 257/315–323
See application file for complete search history.

(56) References Cited

U.S. PATENT DOCUMENTS

| 5,371,704 A | 12/1994 | Okazawa |
| 6,133,098 A | 10/2000 | Ogura et al. |
| 6,207,992 B1 * | 3/2001 | Mori ........................ 257/329 |
| 6,635,533 B1 | 10/2003 | Chang et al. |

FOREIGN PATENT DOCUMENTS

JP        1992-167372        6/1992

* cited by examiner

*Primary Examiner*—Sara Crane
*Assistant Examiner*—Samuel A. Gebremariam
(74) *Attorney, Agent, or Firm*—Andrew D. Fortney

(57) ABSTRACT

Flash memory and methods of fabricating the same are disclosed. An illustrated example flash memory includes a first source formed within a semiconductor substrate; an epitaxial layer formed on an upper surface of the semiconductor substrate; an opening formed within the epitaxial layer to expose the first source; a floating gate device formed inside the opening; and a select gate device formed on the epitaxial layer at a distance from the floating gate device.

18 Claims, 4 Drawing Sheets

(PRIOR ART)

FLASH MEMORY AND METHODS OF FABRICATING THE SAME

FIELD OF THE DISCLOSURE

The present disclosure relates generally to memory devices and, more particularly, to flash memory and methods of fabricating the same.

BACKGROUND

Conventional techniques for fabricating flash memory have been described in the U.S. Pat. Nos. 6,133,098 and 6,635,533.

As shown in FIG. 1, a typical flash memory has a select gate device 11 and a floating gate device 20 that share an impurity region. The floating gate device 20 is formed by sequentially depositing a tunneling oxide 2, a floating gate 3, a first gate dielectric layer 4, and a control gate 5 on a semiconductor substrate 1 at a predetermined width, and thereafter forming first spacers 6 on both sidewalls of the stacked structure including the control gate 5, the first gate dielectric layer 4, the floating gate 3, and the tunneling oxide layer 2.

A source/drain 7 is formed by implanting impurity ions within an area of the semiconductor substrate adjacent the stacked structure (i.e., the control gate 5, the gate dielectric layer 4, the floating gate, and the tunneling oxide layer 2).

The select gate device 11 is formed near one side of the above described floating gate device 20, so as to share the source/drain 7 with the floating gate device 20. The select gate device 11 includes a second gate dielectric layer 8 and a select gate 9 formed on the semiconductor substrate 1 at a predetermined width. It also includes second spacers 10 formed on both sidewalls of the second gate layer 8 and the select gate 9.

In the above described conventional flash memory cell, the floating gate 3 and the control gate 5 are sequentially deposited on the semiconductor substrate 1. As a result, the floating gate device 20 is a vertically extending structure 20 having a height (from the upper surface of the semiconductor substrate 1 to the upper surface of the control gate 5) which is higher than the height of the select gate device 11 (from the upper surface of the semiconductor substrate 1 to the upper surface of the select gate 9).

Accordingly, if an interlayer dielectric layer is formed on the entire surface of the semiconductor substrate including on the floating gate device 20 and on the select gate device 11, the interlayer dielectric layer will have an irregular surface topology. This irregular surface of the interlayer dielectric layer makes it difficult to form a contact at a precise position in a subsequent contact process.

Also, the conventional flash memory cell manufacturing method described above is disadvantageous in that the fabricated flash memory cell occupies a large area since the single floating gate is horizontally connected to the single select gate device.

DETAILED DESCRIPTION

Figure 2A:
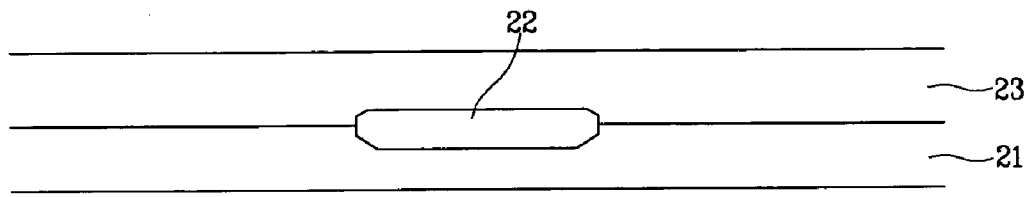
FIG. 2a to FIG. 2e are cross sectional views illustrating an example method of fabricating a flash memory performed in accordance with the teachings of the present invention.

FIG. 2a to FIG. 2d are cross sectional views illustrating an example method of fabricating a flash memory performed in accordance with the teachings of the present invention. FIG. 2e is a cross sectional view illustrating an example flash memory cell constructed in accordance with the teachings of the present invention.

In the example of FIG. 2e, a first source 22 is formed in a predetermined region of the semiconductor substrate 21 and an epitaxial layer 23 is formed on an entire surface of the semiconductor substrate 21. The epitaxial layer 23 is removed from a predetermined area of the first source 22 to form an opening (H) exposing a portion of the first source 22.

A floating gate device 200 is formed inside the opening (H). Select gate devices 100 are formed around the opening (H).

In more detail, the opening (H) is formed such that its bottom surface is located inside the first source 22. A tunneling oxide layer 24 is formed along the inner side walls and along the bottom wall of the opening (H). Preferably, the tunneling oxide layer 24 is formed such that it is thicker on the bottom wall than on the sidewalls of the opening (H).

Floating gates 25 are formed on the inner sidewalls of the opening (H). Preferably, there are two to four floating gates 25. Preferably, the floating gates 25 are located at separate side walls and separated from one another.

A dielectric layer 26 is formed along the portion of the tunneling oxide layer 24 exposed at the bottom of the opening (H), and along the floating gates 25. Preferably, dielectric layer 26 is made out of oxide-nitride-oxide (ONO).

A control gate 28a is formed on the dielectric layer 26. A first drain 29a is formed within the epitaxial layer 23 adjacent to the opening (H) to complete the floating gate device 200.

The select gate devices 100 are formed so as to partially share the first drain 29a as the source/drain region with the floating gate device 200. That is, the gate dielectric layer 27 is formed on the epitaxial layer 23 around the floating gate device 200. The select gates 28b are formed on the gate dielectric layer 27 to have a predetermined width and to have a height which is identical with the height of the control gate 28a.

A second source and a second drain 29b of the select gate device 100 are formed within the epitaxial layer 23 on opposite sides of the select gates 28b relative to the first drain 29.

An example method for fabricating the above described flash memory will now be described with reference to FIGS. 2a-2e. As shown in FIG. 2a, an n+ buried floating source 22 is formed within a p-type silicon substrate 21 using an ion implanting process. The floating source 22 has a predetermined thickness. The floating source 22 is a source region of the floating gate device.

A p type epitaxial silicon layer 23 is grown on the silicon substrate 21. Since the p-type epitaxial silicon layer 23 is intended to be used to form the body of the floating gate device and the body of the select gate device, it should be formed using an appropriate concentration of doping impurity so as to avoid the punch through effect. It is possible to implant the impurity ions at an appropriate concentration after growing the epitaxial silicon layer 23.

Figure 2B:
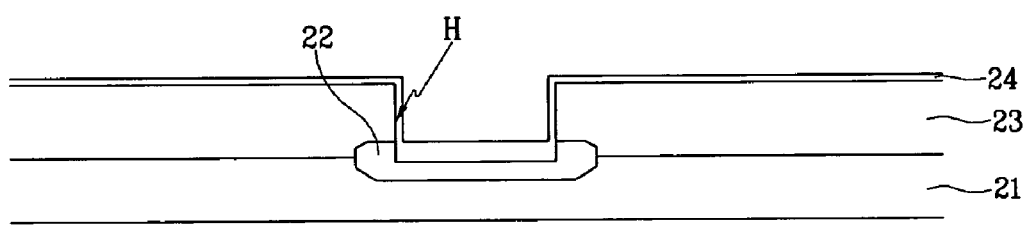

Next, as shown in FIG. 2b, a photoresist pattern is formed by coating a photoresist on the entire surface of the epitaxial silicon layer 23 and then patterning the photoresist to expose a portion of the epitaxial silicon layer 23 where the floating source 22 is to be exposed. The exposed portion of the epitaxial silicon layer 23 is then selectively etched using the photoresist pattern as a mask to form an opening (H). In the illustrated example, the etching is progressed below the upper surface of the floating source 22. In other words, the floating source 22 is etched out to a predetermined depth.

After removing the photoresist pattern, an oxide layer 24 is formed on the whole structure, (i.e. on the sidewalls of the opening (H), on the upper surface of the floating source 22, and on the upper surface of the epitaxial silicon layer 23), by using a dry etching process or a wet etching process. The oxide layer 24 formed on the sidewalls of the opening (H) act as a tunneling oxide layer. Because the n+ buried floating source 22 has a higher doping concentration than the p-type epitaxial silicon layer 23, the oxide layer 24 on the upper surface of the floating source 22 is grown to be thicker than the tunneling oxide layer 24 on the sidewalls of the opening (H) as illustrated in FIG. 2b. The thickly grown oxide layer 24 on the upper surface of the floating source 22 reduces the parasitic capacitance of the floating gate or control gate to be formed to thereby improve the speed of the flash memory cell.

In order to adjust an initial threshold voltage of the flash memory cell, an ion implantation process may be performed before the oxide layer-growing process. In such an approach, impurity ions are implanted at an appropriate concentration in the sidewalls of the opening (H) before the oxide layer 24 forming process. In order for the ions to be uniformly implanted in the sidewalls, the ion implantation process is performed by rotating the silicon wafer 4 times by as much as 90 degree each rotation while the silicon wafer is tilted at a predetermined angle in the range of 10-50°. After the ion implantation process to adjust the initial threshold voltage of the flash memory device, the implanted impurities are activated through rapid thermal processing (RTP). The oxide layer formation process described in the proceeding paragraph is then performed.

Figure 2C:
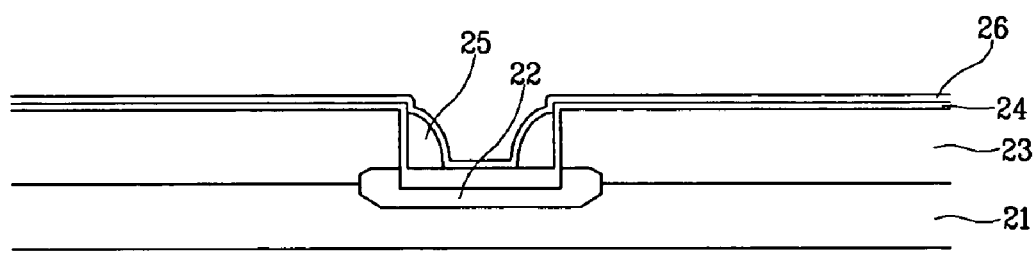

Next, as shown in FIG. 2c, floating gates 25 are formed on the sidewalls of the opening (H) by depositing doped polysilicon and then dry etching the doped polysilicon. (The doped polysilicon can be formed by implanting appropriate impurities through an ion implantation process after depositing polysilicon rather than by depositing doped polysilicon.)

An oxide-nitride-oxide (ONO) 26 is then formed on the entire upper surface of the structures as shown in FIG. 2c.

After forming the sidewall floating gates 25 and the ONO layer 26, if required, it is possible to perform an additional process to adjust the threshold voltage of the select gate device. That is, after the ONO layer deposition process is completed, a threshold voltage adjustment process may be performed by forming a masking layer which exposes areas on which the select gate devices are to be formed, implanting impurity ions in the surface of the epitaxial silicon layer on which the select gate devices are to be formed using the ONO layer 26 as a buffer, removing the remained masking layer, and activating the implanted impurity ions through RTP.

Figure 2D:
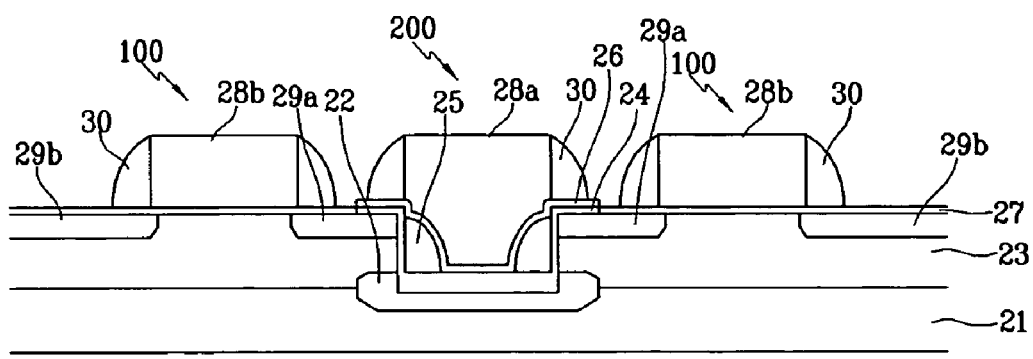
Figure 2E:
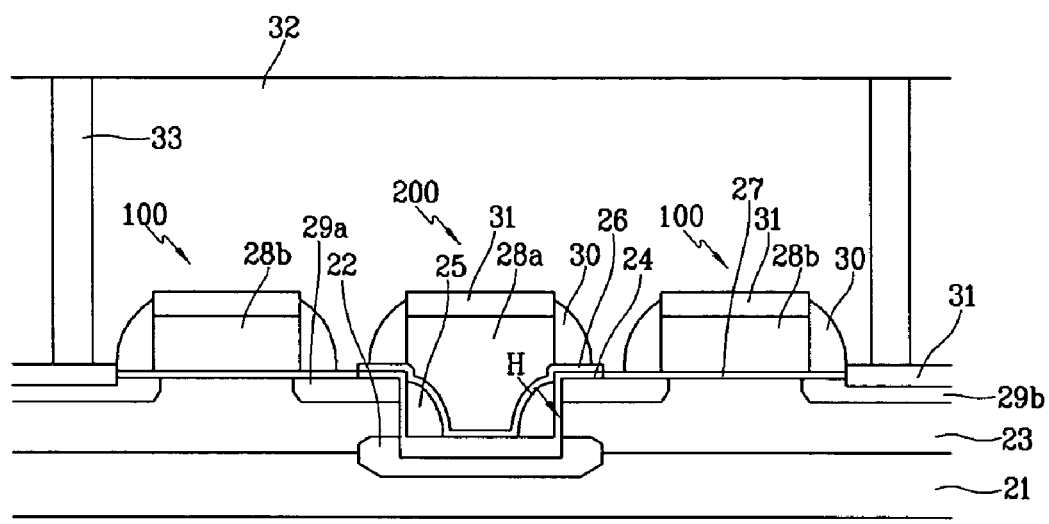

As shown in FIG. 2d, after removing the ONO layer 26 from the area(s) at which the select gate device(s) are to be formed, a gate oxide layer 27 is formed on the exposed area(s) of the epitaxial silicon layer 23 through an oxidation process.

Next, the control gate 28a and the select gate 28b are formed at the same time by forming an undoped polysilicon layer on the entire surface of the structure, implanting impurity ions in the undoped polysilicon layer at a predetermined concentration, and selectively etching the polysilicon layer via patterning and etching processes.

Next, impurity ions are implanted into the epitaxial silicon layer 23 using the control gate 28a and the select gate 28b so as to form the source/drain 29a. The source/drain 29a acts simultaneously as the n+ buried drain of the floating gate device and the source or drain of the select gate device.

An ion implantation region for connecting the n+ buried floating source 22 to an exterior terminal is formed through patterning and ion implantation processes (not shown).

Next, spacers 30 are formed on the sidewalls of the control gate 28a and the select gate(s) 28b.

The source/drain 29a can be formed by forming a LDD (lightly doped drain) structure through impurity ion implantation at a low concentration level, forming the spacers 30 on the sidewalls of the control gate 28a and the select gate(s) 28b, and then implanting impurity ions at a high concentration level. Also, it is possible to implant the impurity ions at the high concentration level immediately before the spacer formation process as shown in FIG. 2e.

Next, as shown in FIG. 2e, a silicide layer 31 is formed on the control gate 28a, the select gate(s) 28b, and the exposed upper surface of the epitaxial silicon layer 23 through a silicide process. After the silicide 31 is formed, an interlayer dielectric layer 32 is formed on the entire surface of the structure and then polished.

The interlayer dielectric layer 32 is selectively etched to form contact holes 33 and the like through conventional MOS transistor fabrication processes to thereby complete the fabrication of the flash memory cell.

Figure 1:
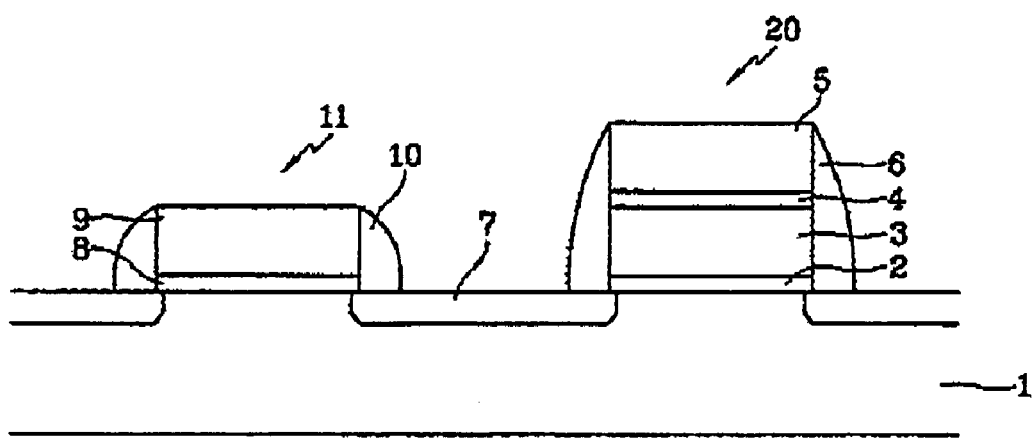
FIG. 1 is a cross sectional view illustrating a conventional flash memory structure.

As shown in FIG. 2e, since the height of the control gate 28a and the height(s) of the select gate(s) 28b are identical, there is no need to increase the thickness of the interlayer dielectric layer 32 and it is possible to form the select gate contact and the control gate contact in a single contact formation process. Also, since the channel region of the floating gate device 200 is vertically formed, the cell space can be dramatically reduced in comparison with the conventional flash memory cell structure shown in FIG. 1.

In the examples of FIGS. 2a-2e, since the control gate 28a and the select gates 28b are formed to have the same height, it is possible to reduce the thickness of the interlayer dielectric layer 32. Also, since the select gate contact and the control gate contact are formed in a single contact formation process, it is possible to simplify the contact formation. Accordingly, the above-described methods are advantageous for reducing the overall manufacturing costs, for improving the yield of the flash memory cell production process, and for improving the reliability of the flash memory.

Also, since the channel region of the floating gate device is vertically formed, the cell space can be dramatically reduced in comparison with the conventional flash memory cell structure, thereby resulting in an increase in the packing density of the flash memory device.

From the foregoing, persons of ordinary skill in the art will appreciate that flash memory cell manufacturing methods have been disclosed which are capable of facilitating a contact formation process by forming a floating gate device 200 and a select gate device 100 at an identical height. Such persons will further appreciate that the disclosed methods are capable of reducing the area occupied by the entire flash memory cell.

In an illustrated example, the flash memory is provided with a floating gate device 200 inside an opening (H) formed by etching a semiconductor substrate, and is further provided with select gate devices 100 formed on the semiconductor substrate such that the control gate 28a and the select gates 28b have an identical height relative to the substrate surface. A flash memory including a floating gate non-volatile memory device and a select gate that are connected with each other is thus provided.

An example method for fabricating a flash memory includes forming a first source in a predetermined region of a semiconductor substrate, forming an epitaxial layer on the semiconductor substrate and the first source, forming an opening partially exposing the first source by selectively etching the epitaxial layer, sequentially forming a tunneling oxide layer, floating gates, and a dielectric layer inside the opening, forming a gate dielectric layer on the epitaxial layer, simultaneously forming a control gate and select gates on the gate dielectric layer by sequentially forming a polysilicon layer on the dielectric layer and selectively etching the polysilicon layer, the select gates are positioned at a predetermined distance from the opening, and forming a first drain within the epitaxial layer between the control gate and the select gates and second sources and drains within the epitaxial layer on sides of the select gates opposite the floating gate by implanting impurity in the surface while using the control gate and the select gates as a mask.

Preferably, the tunneling oxide layer is formed along the side and bottom walls of the opening. Preferably, the floating gates are formed at corners between the side and bottom walls of the opening, and the dielectric layer is formed on the floating gate.

Preferably, 2 to 4 floating gates are separately formed at different corners of the opening.

Preferably, the tunneling oxide layer is formed thicker on the bottom wall of the opening than on the sidewalls of the opening.

Preferably, the dielectric layer is formed in an oxide-nitride-oxide layered structure.

It is noted that this patent claims priority from Korean Patent Application Serial Number 10-2003-0074438, which was filed on Oct. 23, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A flash memory comprising:
   a first source in a semiconductor substrate;
   an epitaxial layer on an upper surface of the semiconductor substrate;
   an opening in the epitaxial layer to expose the first source;
   a floating gate device inside the opening comprising:
   a tunneling oxide layer along side and bottom walls of the opening;
   floating gates on the tunneling oxide layer between the side walls and the bottom wall of the opening;
   a dielectric layer on the floating gates and on the tunneling oxide layer between the floating gates; and
   a control gate on the dielectric layer; and
   a select gate device on the epitaxial layer at a distance from the floating gate device, wherein the select gate device has a select gate having a height substantially identical with a height of the control gate.

2. A flash memory as defined in claim 1, wherein the tunneling oxide layer is thicker on the bottom wall of the opening than on the side walls of the opening.

3. A flash memory as defined in claim 1, wherein the bottom wall of the opening is etched to a predetermined depth into the first source.

4. A flash memory as defined in claim 1, wherein the select gate device comprises:
   a gate dielectric on the epitaxial layer;
   select gates on the gate dielectric adjacent a first drain; and
   a second source and a second drain in the epitaxial layer on a side of the select gate opposite the first drain.

5. A flash memory as defined in claim 1, wherein the select gate device comprises a number of select gates and the floating gate device comprises a number of floating gates, and the number of select gates is identical to the number of floating gates.

6. A flash memory as defined in claim 1, wherein the floating gates are separate from one another, on opposite side walls.

7. A flash memory as defined in claim 1, wherein the dielectric layer comprises an oxide-nitride-oxide (ONO) layer.

8. A flash memory as defined in claim 1, wherein the first source comprises n-type impurities.

9. A flash memory as defined in claim 1, wherein the semiconductor substrate comprises a p-type silicon substrate.

10. A flash memory as defined in claim 1, wherein the epitaxial layer comprises silicon.

11. A flash memory as defined in claim 1, wherein the epitaxial layer comprises an appropriate concentration of p-type impurities to avoid a punch through effect.

12. A flash memory as defined in claim 1, wherein the first source has a higher doping concentration than the epitaxial layer.

13. A flash memory as defined in claim 1, wherein the side walls of the opening comprise an appropriate concentration of impurity ions to adjust the initial threshold voltage of the flash memory.

14. A flash memory as defined in claim 1, wherein the floating gates comprise doped polysilicon.

15. A flash memory as defined in claim 1, further comprising spacers on sidewalls of the control gate and the select gate.

16. A flash memory as defined in claim 1, further comprising a silicide layer on the on the control gate, the select gate, and an exposed upper surface of the epitaxial layer.

17. A flash memory as defined in claim 16, further comprising a dielectric layer on the floating gate device, the select gate device, and the silicide layer.

18. A flash memory as defined in claim 17, further comprising contact holes in the dielectric layer to die silicide layer on the exposed upper surface of the epitaxial layer.

* * * * *